(12) United States Patent
Chang et al.

(10) Patent No.: US 11,342,247 B2
(45) Date of Patent: May 24, 2022

(54) LEADFRAME WITH VERTICALLY SPACED DIE ATTACH PADS

(71) Applicant: TEXAS INSTRUMENTS INCORPORATED, Dallas, TX (US)

(72) Inventors: Chia-Yu Chang, Taipei Hsien (TW); Chih-Chien Ho, Taipei Hsien (TW); Steven Su, Tainan (TW)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/788,695

(22) Filed: Feb. 12, 2020

(65) Prior Publication Data
US 2020/0185308 A1 Jun. 11, 2020

Related U.S. Application Data

(62) Division of application No. 15/151,177, filed on May 10, 2016, now Pat. No. 10,600,724.

(51) Int. Cl.
| | | |
|---|---|---|
| *H01L 23/495* | (2006.01) | |
| *H01L 23/00* | (2006.01) | |
| *G06F 30/394* | (2020.01) | |
| *H01L 23/31* | (2006.01) | |

(52) U.S. Cl.
CPC ...... *H01L 23/49503* (2013.01); *G06F 30/394* (2020.01); *H01L 23/49541* (2013.01); *H01L 23/49548* (2013.01); *H01L 23/49551* (2013.01); *H01L 24/00* (2013.01); *H01L 23/3107* (2013.01); *H01L 2224/48091* (2013.01); *H01L 2224/48137* (2013.01); *H01L 2224/48247* (2013.01); *H01L 2224/73265* (2013.01); *H01L 2225/06506* (2013.01); *H01L 2225/06527* (2013.01); *H01L 2225/06555* (2013.01); *H01L 2225/06582* (2013.01); *H01L 2225/06593* (2013.01); *H01L 2924/181* (2013.01)

(58) Field of Classification Search
CPC ................................. H01L 23/49503
See application file for complete search history.

(56) References Cited

U.S. PATENT DOCUMENTS

| | | |
|---|---|---|
| 6,072,230 A | 6/2000 | Carter, Jr. et al. |
| 2011/0003432 A1 | 1/2011 | Noquil et al. |
| 2011/0089546 A1 | 4/2011 | Bayan |
| 2014/0071650 A1 | 3/2014 | Flores et al. |
| 2015/0332992 A1* | 11/2015 | Im ............... H01L 23/49503 257/139 |
| 2019/0057928 A1 | 2/2019 | Kawashima et al. |

* cited by examiner

*Primary Examiner* — Julio J Maldonado
*Assistant Examiner* — Stanetta D Isaac
(74) *Attorney, Agent, or Firm* — Ronald O. Neerings; Charles A. Brill; Frank D. Cimino

(57) ABSTRACT

A leadframe includes a first die attach pad ("DAP") having a first longitudinally extending edge surface and a second DAP having a first longitudinally extending edge surface. The second DAP is positioned with the first longitudinally extending edge surface thereof in adjacent, laterally and vertically spaced relationship with the first longitudinally extending edge surface of the first DAP.

32 Claims, 4 Drawing Sheets

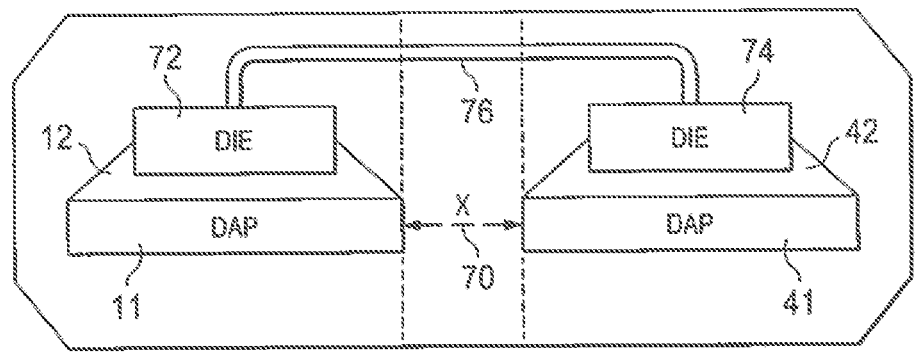
FIG. 6
(PRIOR ART)
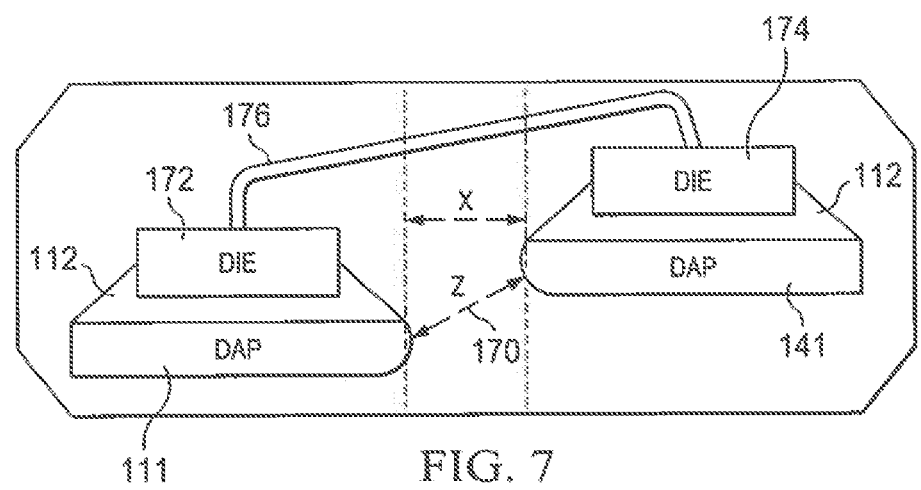
FIG. 7
201 — LOWERING THE FIRST DAP TOP SURFACE RELATIVE TO THE SECOND DAP TOP SURFACE WHILE MAINTAINING THE LATERAL GAP DISTANCE UNCHANGED
FIG. 8

LEADFRAME WITH VERTICALLY SPACED DIE ATTACH PADS

This application is a Divisional of application Ser. No. 15/151,177 filed May 10, 2016.

BACKGROUND

Some integrated circuit ("IC") packages require isolation between a power source and a monitor or control circuit. Such IC packages may employ a leadframe with split die attach pads to ensure isolation of the respective grounds.

SUMMARY

A leadframe includes a first die attach pad ("DAP") having a first longitudinally extending edge surface and a second DAP having a first longitudinally extending edge surface. The second DAP is positioned with the first longitudinally extending edge surface thereof in adjacent, laterally and vertically spaced relationship with the first longitudinally extending edge surface of the first DAP.

A leadframe assembly includes a first die attach pad ("DAP") having a first longitudinally extending edge surface and a second DAP having a first longitudinally extending edge surface. The second DAP is positioned with the first longitudinally extending edge surface thereof in adjacent, laterally and vertically spaced relationship with the first longitudinally extending edge surface of the first DAP. A first die is mounted on the first DAP and a second die is mounted on the second DAP.

An integrated circuit package includes a leadframe assembly with a first die attach pad ("DAP") having a first longitudinally extending edge surface and a second DAP having a first longitudinally extending edge surface. The second DAP is positioned with the first longitudinally extending edge surface thereof in adjacent, laterally and vertically spaced relationship with the first longitudinally extending edge surface of the first DAP. A first die is mounted on the first DAP and a second die is mounted on the second DAP. A layer of mold compound covers the leadframe and the first and second dies.

BRIEF DESCRIPTION OF THE DRAWINGS

FIG. 6 a schematic view of the two DAPs of FIGS. 1 and 2 with attached dies.

FIG. 7 is a schematic view of the two DAPs of FIGS. 3 and 4 with attached dies.

FIG. 8 illustrates a method of redesigning an integrated circuit package without changing the package footprint.

DETAILED DESCRIPTION

As used in this disclosure, directional terms such up, down, above, below, top, bottom, vertical, lateral, horizontal, etc., are used in a relative sense to establish a frame of reference for describing the relationship between objects or parts of objects, usually with reference to the drawings. These terms are not used in any absolute sense, such as with reference to the surface of the earth. Thus, as used in this relative sense, the writing surface of a desk, once referenced as the top of the desk, would still be correctly referred to as the top of the desk, even if the desk were flipped onto one side or upside down.

Figure 1:
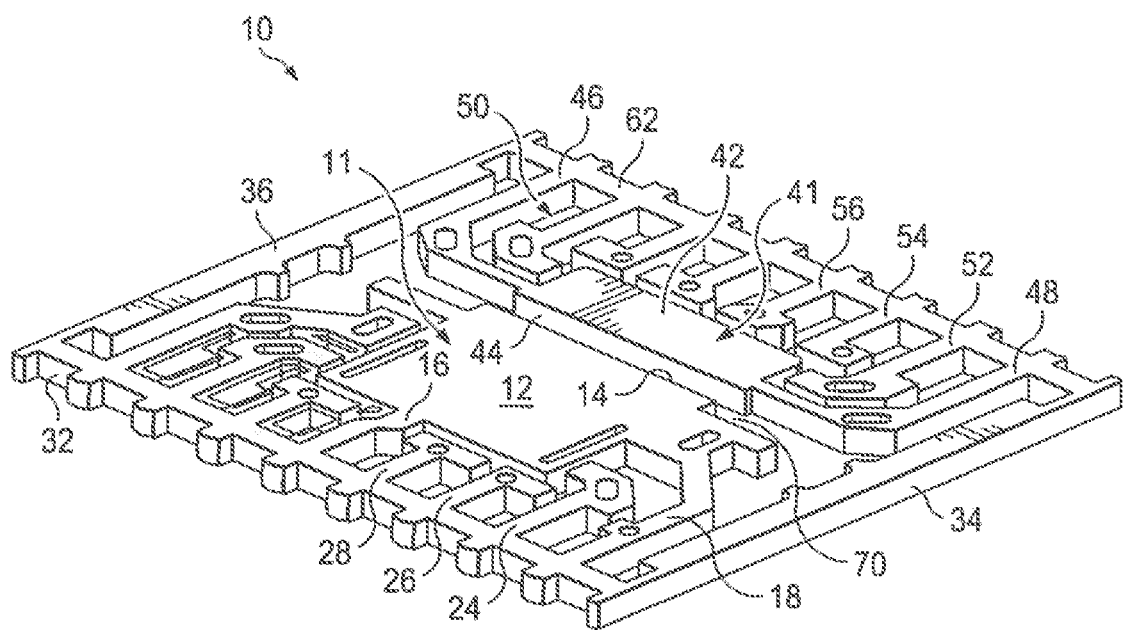
FIG. 1 is a top isometric view of a prior art leadframe with a first and second die attach pad (DAP).
Figure 2:
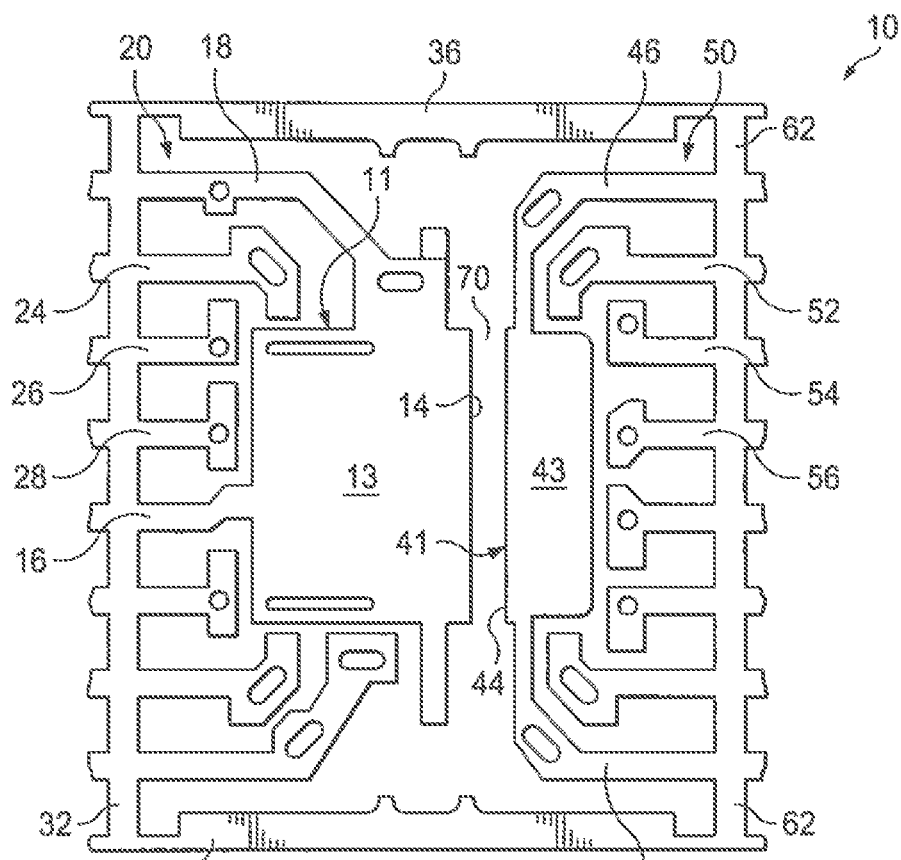
FIG. 2 is a bottom isometric view of the prior art leadframe of FIG. 1.

FIG. 1 is a top isometric view of a prior art leadframe 10 and FIG. 2 is a bottom isometric view of the prior art leadframe of FIG. 1. The leadframe 10 has a first die attach pad ("DAP") 11 and second DAP 41. The first DAP 11 has a top surface 12, a bottom surface 13, and a first vertical edge surface 14 extends between the top and bottom surfaces. A first tie bar 16 and a second tie bar 18 support the first DAP 11 within the leadframe 10 and connect the DAP 11 to a first dam bar 32. The first DAP 11 is surrounded on one side by a first plurality of leads 20 that includes a first lead 24, second lead 26, a third lead 28, etc. Outer end portions of the first plurality of leads 20 are connected to the first dam bar 32. The first dam bar 32 is in turn connected at one end to a first support rail 34 and at a second end to a second support rail 36.

The second DAP 41 has a top surface 42, a bottom surface 43 and a vertical edge surface 44. The second DAP 41 is connected to the leadframe 10 by a first tie bar 46 and the second tie bar 48. The tie bars 46, 48 support the DAP 41 within the leadframe 10. A plurality of leads 50, including a first lead 52, a second lead 54, third lead 56, etc., are positioned around one side of the second DAP 41. Outer portions of the tie bars 46, 48 and the plurality of leads 50 are connected to a second dam bar 62. The second dam bar 62, like the first dam bar 32, is connected at opposite ends to the first and second support rails 34, 36.

The first vertical edge surface 14 of the first DAP 11 and the second vertical edge surface 44 of the second DAP 41 are parallel surfaces that are positioned in opposed adjacent relationship and separated by a gap 70.

FIG. 6 a schematic view of the two DAPs 11, 41 of FIGS. 1 and 2 with attached dies 72, 74. The leadframe 10, DAPs 11, 41 and dies 72, 74 mounted thereon are covered with a layer of mold compound (not shown) that ordinarily fills the gap 70 between the two DAPs 11, 41. The separation distance "x" between the two dies is sufficient to prevent a partial dielectric discharge failure ("PD failure") when the gap 70 is filled with mold compound. However, during the molding process, bubbles sometimes form in the mold compound such that the gap 70 is not entirely filled with mold. The gap 70 may then be filled partially or entirely with air. Because the dielectric coefficient of air is less than that of mold compound, a PD failure may occur when there is an air void in the gap 70 and the separation distance between DAPs 11, 41 is only x.

Figure 3:
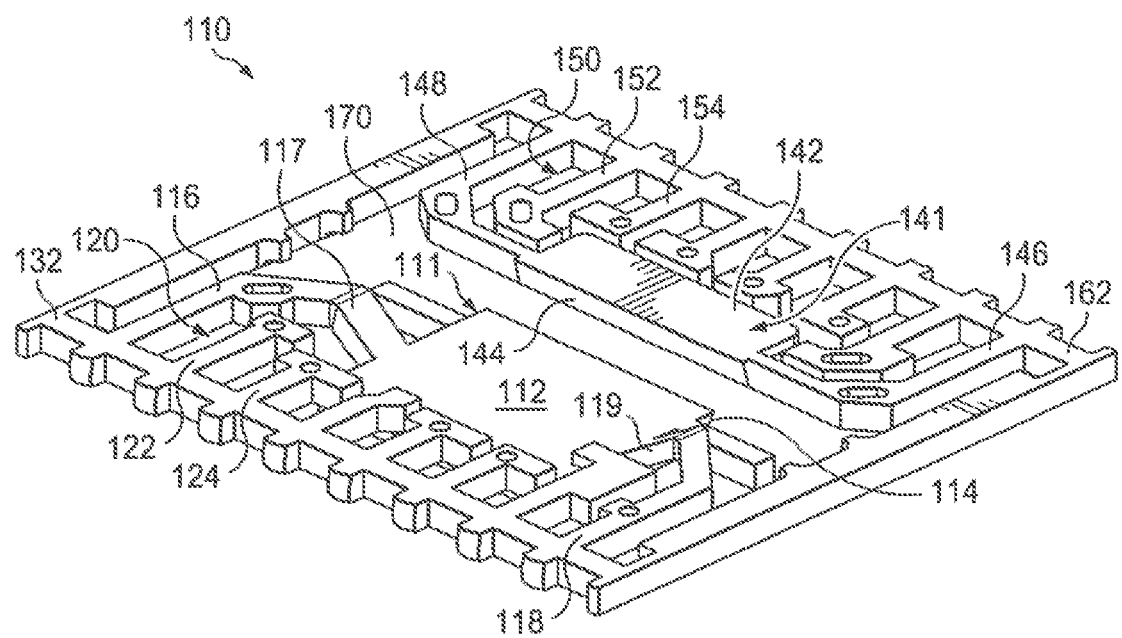
FIG. 3 is a top isometric view of a leadframe with two DAPs that are positioned at different elevations.
Figure 4:
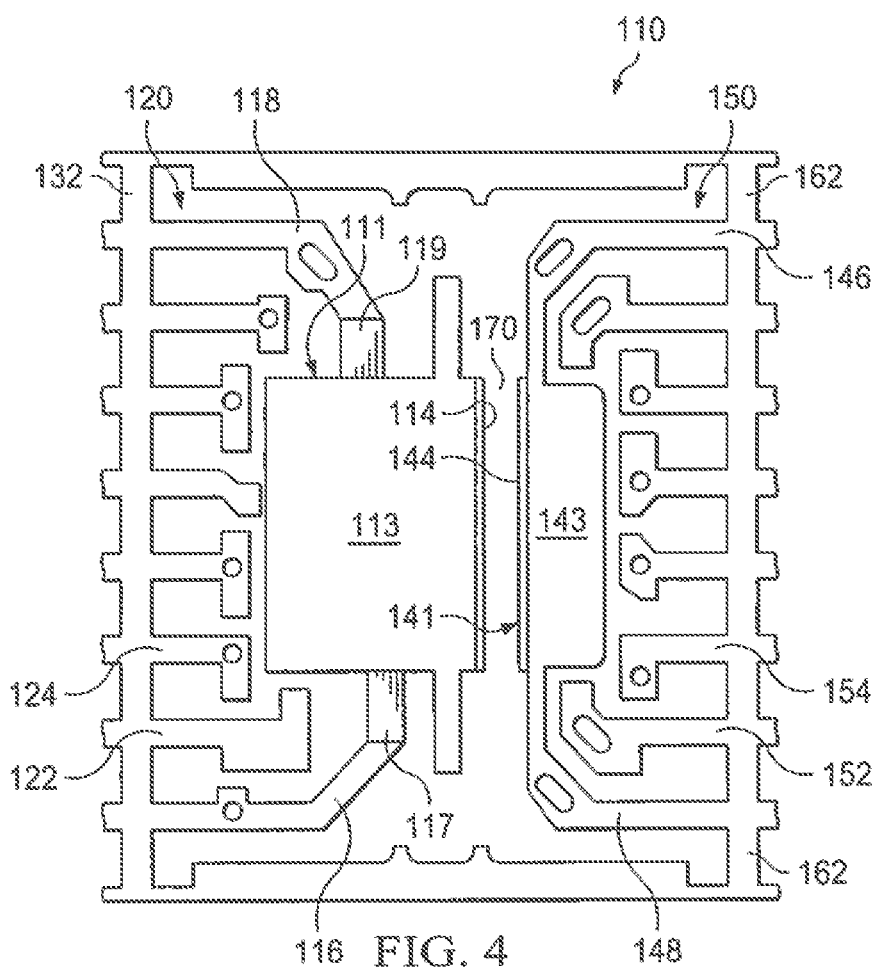
FIG. 4 is a bottom isometric view of the leadframe a FIG. 3.

FIG. 3 is a top isometric view of a leadframe 110 with two DAPs 111, 141 that are positioned at different elevations. FIG. 4 is a bottom isometric view of the leadframe 110 of FIG. 3. The first leadframe 110 has a first DAP 111 having a top surface 112, a bottom surface 113 and a first edge surface 114 extending therebetween. A first tie bar 116 connects one end of the first DAP 111 to a first dam bar 132. The first tie bar 116 has a down-set portion 117. A second tie bar 118 connects the other end of the first DAP 111 to the first dam bar 132. The second tie bar 118 has a down-set portion 119. The tie bars 116, 118 and down-set portions 117, 119 thereof are constructed and arranged such that the top surface 112 of the DAP 111 is positioned in parallel relationship to the top surface of the first dam bar 132, but at a lower elevation. The first DAP 111 is surrounded on one side by a plurality of leads 120 that are positioned at an elevation above that of the first DAP 111. The leads 120 may include a first lead 122, a second lead 124, etc.

With continued reference to FIGS. 3 and 4, the leadframe 110 has a second DAP 141 with a top surface 142, bottom surface 143 connected by an edge surface 144. The leadframe 110 has a first DAP 111 having a top surface 112, a bottom surface 113 and a first edge surface 114 extending therebetween. A first tie bar 146 connects one end of the second DAP 141 to a second dam bar 162. A second tie bar 148 connects the other end of the second DAP 141 to the second dam bar 132. The second DAP 141 is surrounded on one side by a plurality of leads 150 that are positioned at an elevation above that of the first DAP 111. The leads 150 may include a first lead 152, a second lead 154, etc. The second DAP 141 is positioned parallel to and at a higher elevation than the first DAP 111. The two opposite vertical edge surfaces 114, 144 of the two DAPs 111, 141 are parallel surfaces but at different horizontal levels, as described further below.

Figure 5:
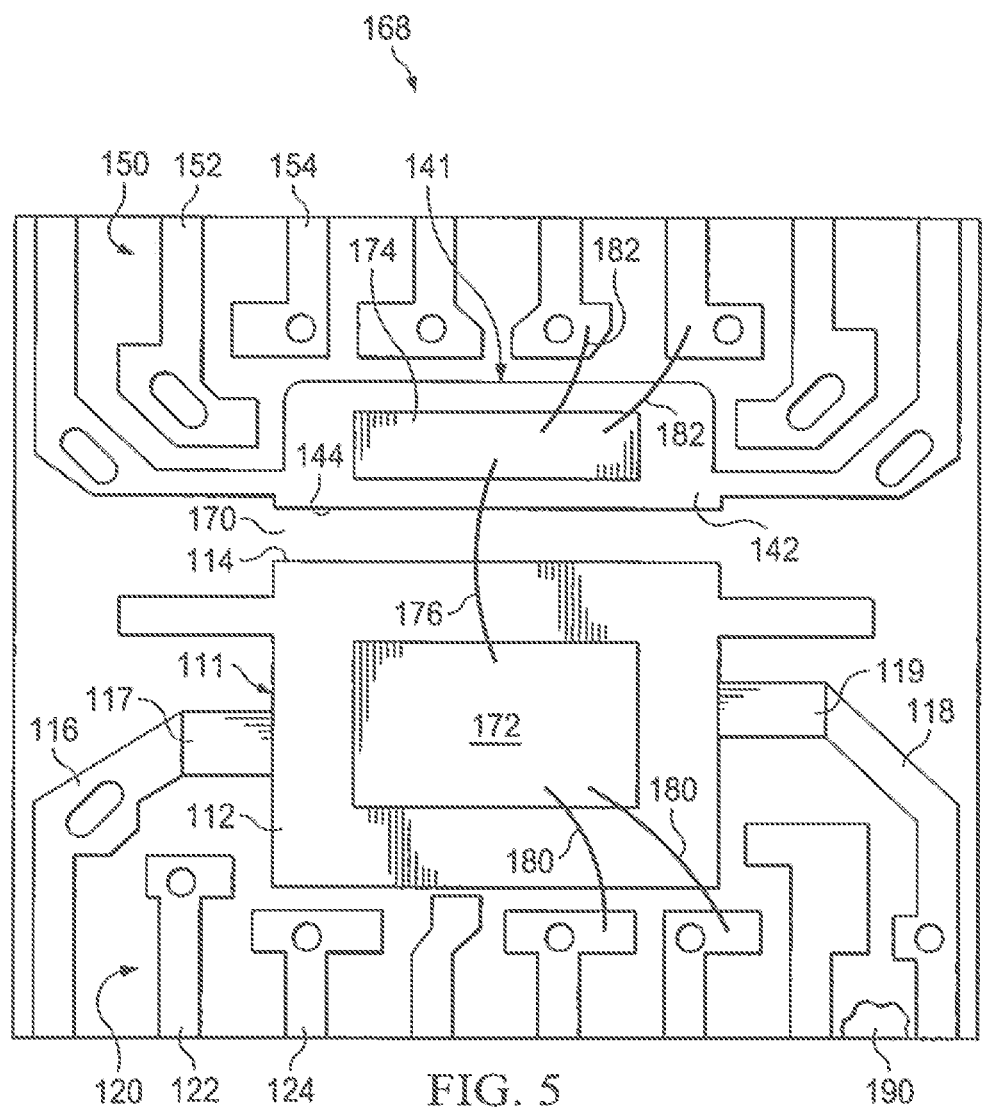
FIG. 5 is a partially cutaway, top plan view of an integrated circuit package having the leadframe illustrated in FIGS. 3 and 4.

FIG. 5 is a top plan view of an integrated circuit (IC) package 168 that incorporates the leadframe 110 illustrated in FIGS. 3 and 4. The IC package 168 includes a first die 172 mounted on the first DAP 111, and a second die 174 mounted on the second DAP 141. The two dies 172, 174 are electrically connected by one or more bond wires 176. The first die 172 is also connected by bond wires 180 to at least some of the leads 120. The second die 174 is electrically connected to at least some of the leads 150 by bond wires 182. A layer of mold compound 190, only a small fragment of which is shown in FIG. 5, covers the entire leadframe 110, dies 172, 174 and bond wires 176, 180, 182. In some IC package embodiments outer end portions of the leads on 120, 150 are exposed at surface portions of the mold compound layer 190.

The leadframe 110, shown in FIGS. 3 and 4, is a modified design of the leadframe shown in FIGS. 1 and 2. This design eliminates problem of partial electrical discharge due to the presence of air in the gap 70 between the two DAP edge surfaces 14, 44 in the old design. With this new design, it is not necessary to increase the lateral distance between the adjacent DAP edge surfaces (i.e., 14, 44 in the old design and 114, 144 in the new design both have the same lateral spacing "x"). Also it is not necessary to move the two dies mounted on the DAPs farther apart, which would require the use of laterally larger DAPs or smaller dies, if the lateral spacing x between the DAPs were to remain unchanged. Thus, the foot print of the redesigned leadframe 110 may remain the same as the footprint of the original leadframe 10 and the size of the dies used may remain the same. This is a significant manufacturing advantage because most of the manufacturing tooling and packaging can remain unchanged. Expensive replacement operations are thus avoided.

The difference between the two leadframes 10, 110 are illustrated by FIGS. 6 and 7. In the original leadframe 10, as shown schematically in FIG. 6, the distance between the two vertical edge surfaces 14, 44 necessary to avoid partial discharge failure with mold compound filling gap 70 is distance Y. However, as shown schematically by FIG. 7, the separation distance between the two edge surfaces to prevent partial discharge failure when there is only air in gap 70, is a larger distance "Y" (not shown). If this larger distance "Y" were achieved by moving the two DAPs 11, 41 farther apart laterally, it would change the footprint of the leadframe 10, which is undesirable. If this larger separation distance were achieved by using smaller DAPs it would also require smaller versions of dies 72, 74, in order to fit them on the smaller DAPs, another undesirable change.

However, in the redesigned leadframe 110, schematically illustrated in FIG. 7, the effective separation distance between the edge surfaces 114 and 144 of DAPs has been changed to "z", which is greater than x, by changing the relative elevations of the two DAPs, for example, by lowering DAP 111 relative to DAP 141. The effective separation distance has also been increased by changing the slope of the two edge surfaces 114 and 144 so that they are no longer two planar parallel surfaces. In the illustrated embodiment the shape of the edge surfaces 114 and 144 have been changed by sloping each surface 114 and 144 downwardly and away from the other surface. Generally, the greater the slope, the larger the effective distance Z becomes. In another embodiment, shown by dashed lines in FIG. 7, the two surfaces 114 and 144 have been rounded, which also has the effect of increasing the effective separation distance z between surfaces 114 and 144, as compared to the original parallel edge surfaces 14, 44.

It will be understood by those skilled in the art that relative elevation differences can be achieved by raising or lowering either DAP relative the other or by raising one while lowering the other. It does not matter which of the DAPs is at the relatively higher elevation.

It will be appreciated from the above that method of redesigning an integrated circuit package without changing the package footprint has been disclosed herein. The integrated circuit package is of the type having a leadframe assembly with a first and second die attach pad ("DAP") each having a top surface and a vertical edge surface, the top surfaces positioned at the same elevation, the vertical edge surfaces being parallel and separated by a gap having a gap distance, said integrated circuit package being subject to partial electrical discharge failure associated with air in mold compound that ordinarily fills the lateral gap. The method is illustrated in FIG. 8 and includes, as shown a block 201, lowering the first DAP top surface relative to the second DAP top surface while maintaining the lateral gap distance unchanged. The method may further include changing at least one of the vertical edge surfaces to a non-vertical edge surface.

Embodiments of a leadframe with die attach pads at different elevations and various assemblies and IC packages that incorporate this leadframe have been expressly described in detail herein. Various alternative leadframe embodiments, leadframe assembly embodiments and IC package embodiments, will occur to others skilled in the art after reading this disclosure. It is intended that the language of the appended claims be construed broadly to cover all such alternative embodiments, except as limited by the prior art.

What is claimed is:

1. A leadframe comprising:
   a first die attach pad ("DAP") having a first longitudinally extending edge surface; and
   a second DAP having a second longitudinally extending edge surface, the second DAP being positioned with the second longitudinally extending edge surface thereof in adjacent, laterally and vertically spaced relationship with the first longitudinally extending edge surface of said first DAP, wherein at least one of the first longitudinally extending edge surface and the second longitudinally extending edge surface is a non-planar edge surface.

2. The leadframe of claim 1 wherein the non-planar edge surface is a rounded surface.

3. The leadframe of claim 2 wherein the first edge surface of the first DAP is sloped.

4. The leadframe of claim 3 wherein the second edge surface of the second DAP is sloped.

5. The leadframe of claim 1 wherein the first longitudinally extending edge surface and the second longitudinally extending edge surface are both non-planar edge surfaces.

6. The leadframe of claim 1 further comprising at least one downset tie-bar supporting the first DAP.

7. The leadframe of claim 6 wherein the at least one downset tie-bar comprises first and second downset tie-bars.

8. The leadframe of claim 1 further comprising a first set of leads positioned adjacent to the first DAP and a second set of lead positioned adjacent to the second DAP.

9. The leadframe of claim 8 wherein the first DAP has a top surface positioned at a first elevation and the second DAP has a top surface positioned at a second elevation above the first elevation.

10. The leadframe of claim 9 wherein the first set of leads and the second set of leads are positioned at the second elevation.

11. The leadframe of claim 1 wherein the first longitudinally extending edge surface and the second longitudinally extending edge surface are both rounded edge surfaces.

12. A leadframe assembly comprising:
a first die attach pad ("DAP") having a first longitudinally extending edge surface;
a second DAP having a second longitudinally extending edge surface, the second DAP being positioned with the second longitudinally extending edge surface thereof in adjacent, laterally and vertically spaced relationship with the first longitudinally extending edge surface of the first DAP, wherein at least one of the first longitudinally extending edge surface and the second longitudinally extending edge surface is a non-planar edge surface;
a first die mounted on the first DAP; and
a second die mounted on the second DAP.

13. The leadframe of claim 12 wherein the non-planar edge surface is a rounded surface.

14. The leadframe assembly of claim 13 wherein the first set of leads and the second set of leads are positioned at the second elevation.

15. The leadframe assembly of claim 12 further comprising at least one downset tie-bar supporting the first DAP.

16. The leadframe assembly of claim 15 further comprising at least one bond wire having a first end electrically connected to the first die and a second end electrically connected to the second die.

17. The integrated circuit package of claim 15 wherein the at least one downset tie-bar comprises first and second downset tie-bars.

18. The leadframe assembly of claim 12 further comprising a first set of leads positioned adjacent to the first DAP and a second set of leads positioned adjacent to the second DAP.

19. The leadframe assembly of claim 12 wherein the first DAP has a top surface positioned at a first elevation and the second DAP has a top surface positioned at a second elevation above the first elevation.

20. The integrated circuit package of claim 12 wherein the first longitudinally extending edge surface and the second longitudinally extending edge surface are both non-planar edge surfaces.

21. An integrated circuit package comprising:
a leadframe assembly having:
a first die attach pad ("DAP") having a first longitudinally extending edge surface;
a second DAP having a second longitudinally extending edge surface, the second DAP being positioned with the second longitudinally extending edge surface thereof in adjacent, laterally and vertically spaced relationship with the first longitudinally extending edge surface of the first DAP, wherein at least one of the first longitudinally extending edge surface and the second longitudinally extending edge surface is a non-planar edge surface;
a first die mounted on the first DAP; and
a second die mounted on the second DAP; and
a layer of mold compound covering the leadframe and the first and second dies.

22. The integrated circuit package of claim 21 wherein the non-planar edge surface is a rounded surface.

23. The integrated circuit package of claim 22 further comprising at least one downset tie-bar supporting the first DAP.

24. The integrated circuit package of claim 23 further comprising at least one bond wire having a first end electrically connected to the first die and a second end electrically connected to the second die.

25. The integrated circuit package of claim 23 wherein the first set of leads and the second set of leads are positioned at the second elevation.

26. The integrated circuit package of claim 22 further comprising a first set of leads positioned adjacent to the first DAP and a second set of leads positioned adjacent to the second DAP.

27. The integrated circuit package of claim 22 wherein the first DAP has a top surface positioned at a first elevation and the second DAP has a top surface positioned at a second elevation above the first elevation.

28. The integrated circuit package of claim 22 wherein the first edge surface of the first DAP is sloped.

29. The integrated circuit package of claim 28 wherein the second edge surface of the second DAP is sloped.

30. The integrated circuit package of claim 21 wherein the first longitudinally extending edge surface and the second longitudinally extending edge surface are both non-planar edge surfaces.

31. The integrated circuit package of claim 21 wherein the first longitudinally extending edge surface and the second longitudinally extending edge surface are both non-planar edge surfaces.

32. The integrated circuit package of claim 31 wherein the first longitudinally extending edge surface and the second longitudinally extending edge surface are both rounded edge surfaces.

* * * * *